United States Patent
Rockett

(10) Patent No.: US 6,369,630 B1
(45) Date of Patent: Apr. 9, 2002

(54) SINGLE-EVENT UPSET HARDENED RECONFIGURABLE BI-STABLE CMOS LATCH

(75) Inventor: Leonard R. Rockett, Washington, DC (US)

(73) Assignee: BAE Systems Information and Electronic Systems Integration Inc., Manassas, VA (US)

(*) Notice: Subject to any disclaimer, the term of this patent is extended or adjusted under 35 U.S.C. 154(b) by 0 days.

(21) Appl. No.: 09/449,723

(22) Filed: Nov. 24, 1999

(51) Int. Cl.[7] ............................................. H03K 3/0233
(52) U.S. Cl. ........................ 327/210; 365/154; 365/156; 327/208
(58) Field of Search ................................ 327/199, 200, 327/208, 209, 210, 219; 365/154, 156

(56) References Cited

U.S. PATENT DOCUMENTS

| | | | |
|---|---|---|---|
| 3,493,786 A | 2/1970 | Ahrons et al. ............... 327/210 |
| 4,685,056 A | 8/1987 | Barnsdale, Jr. et al. ..... 364/200 |
| 4,797,804 A | 1/1989 | Rockett, Jr. .................. 365/156 |
| 4,809,226 A | 2/1989 | Ochoa, Jr. .................... 365/156 |
| 4,849,653 A * | 7/1989 | Imai et al. .................... 327/217 |
| 4,852,060 A | 7/1989 | Rockett, Jr. .................. 365/154 |
| 4,956,814 A | 9/1990 | Houston ....................... 365/154 |
| 5,018,102 A | 5/1991 | Houston ....................... 365/95 |
| 5,053,848 A | 10/1991 | Houston et al. .............. 357/51 |
| 5,084,873 A | 1/1992 | Houston ....................... 371/4 |
| 5,111,429 A | 5/1992 | Whitaker ..................... 365/156 |
| 5,135,882 A | 8/1992 | Karniewicz .................. 437/52 |
| 5,175,605 A | 12/1992 | Pavlu et al. .................. 257/369 |
| 5,307,142 A | 4/1994 | Corbett et al. ............... 365/156 |
| 5,311,070 A | 5/1994 | Dooley ........................ 327/208 |
| 5,363,328 A | 11/1994 | Browning, III et al. ..... 365/154 |
| 5,406,513 A | 4/1995 | Canaris et al. ............... 365/181 |
| 5,504,703 A | 4/1996 | Bansal ......................... 365/156 |
| 5,559,461 A | 9/1996 | Yamashina et al. .......... 327/205 |
| 5,604,755 A | 2/1997 | Bertin et al. .................. 371/48 |
| 5,627,787 A | 5/1997 | McClure ...................... 365/201 |
| 5,764,089 A | 6/1998 | Partovi et al. ............... 327/200 |
| 5,821,788 A | 10/1998 | Pascucci et al. ............. 327/143 |
| 5,870,332 A | 2/1999 | Lahey et al. ................. 365/156 |

FOREIGN PATENT DOCUMENTS

| | | |
|---|---|---|
| EP | 0 357 980 | 3/1990 |
| EP | 0 432 846 A1 | 6/1991 |
| EP | 0 500 958 A1 | 8/1991 |

OTHER PUBLICATIONS

A copy of PCT International Search Report mailed on Jun. 20, 2000 (7 pages).
L. Rockett, Jr., "Designing Hardened Bulk/Epi CMOS Circuits," *Proceedings of the IEEE*, vol. 76, No. 11, Nov., 1988, pp. 1474–1483.
L. Rockett, Jr., "An SEU–Hardened CMOS Data Latch Design," *IEEE Transactions on Nuclear Science*, vol. 35, No. 6, Dec., 1988, pp. 1682–1687.
"On–Chip Receiver Featuring Fall–Through Radiation–Hardened Latching," *IBM Technical Disclosure Bulletin*, vol. 32, No. 12, May, 1990, pp. 389–392.

* cited by examiner

*Primary Examiner*—Tuan T. Lam
(74) *Attorney, Agent, or Firm*—Dicke, Billing & Czaja, P.A.

(57) ABSTRACT

The present invention provides a single-event upset (SEU) hardened integrated circuit. The integrated circuit includes an SEU hardened asymmetric bi-stable CMOS latch having a first logic state and a second logic state. A supply voltage is operably coupled to the asymmetric bi-stable latch, where upon activation of the supply voltage the asymmetric bi-stable latch is always set to the first logic state. A switch may be provided for changing the latch from the first logic state to the second logic state.

47 Claims, 8 Drawing Sheets

SINGLE-EVENT UPSET HARDENED RECONFIGURABLE BI-STABLE CMOS LATCH

THE FIELD OF THE INVENTION

The present invention relates to a single-event upset (SEU) hardened integrated circuit, and, more particularly to an SEU hardened asymmetric bi-stable CMOS latch wherein when the latch is powered-up it is set to a predetermined state.

BACKGROUND OF THE INVENTION

In combinational logic circuits, data latches are susceptible to single-event upsets (SEUs). The radiation hardness requirements imposed on systems used in space and strategic applications necessitate that the data latches in logic chips be SEU hardened. Data latches are used in latch chains and as separate logic gates for data manipulation in storage. Several data latches may lie in critical signal paths, so consequently, data latch hardening techniques must preserve latch speed. Data latches outside the critical signal paths do not require as high performance level as data latches which are located in a critical signal path. The hardness against SEUs (i.e., ability to withstand single particle hits without logic upset) may be achieved by virtue of the design of the data latch or through the fabrication process or a combination of both. Design hardening offers the most practical approach to gaining SEU protection without seriously degrading latch performance.

Programmable logic circuits (e.g., field programmable gate arrays (FPGAs)) are used widely in digital system designs. Programmable logic circuits are comprised of an array of unconnected logic elements that can be programmed (i.e., configured) to form a complex logic circuit to accomplish a prescribed function. Most programmable logic circuits employ fuses, anti-fuses, or custom designed metal mask levels to configure the logic elements. Once configured, the resulting logic circuit design is permanent ("firm") and cannot be altered later.

Reconfigurable (or "reprogrammable") logic circuits can be changed to form a different logic function on demand. Reconfigurable logic circuits generally employ a bi-stable data storage clement (e.g., a data latch or an SRAM cell) within which the logic configuration data is stored. Depending on whether a logical "one" or logical "zero" data is stored in the data storage element, the logic, configuration interface gate or device connected to the data storage element's output is either on or off. In that way, blocks of previously unconnected logic elements are connected and the logic circuit is configured. Selectively changing the data stored in some of the data storage elements allows one to reconfigure the logic circuits when desired. Reconfigurable logic circuits offer a significant advantage over one-time programmable "firm" logic circuits in that the hardware can be changed even after the digital system has been deployed for many years.

There is a lot of reluctance to use reconfigurable logic circuits in space and military applications that generally must operate in stringent, noisy radiation environments. The major fear is that the logic-configuration data storage elements may be strick by a single-event upset (SEU) inducing heavy ion, upsetting the data stored, and thereby unintentionally reconfigure the logic circuit. Ways to circumvent this threat involve techniques like triple module redundancy, for example, which requires significant amounts of design and operation overhead and are never completely fool proof.

As used herein and as known in the art, complimentary MOS (CMOS) refers to integrated circuits which employ both p-channel field effect transistor devices (PFET) and n-channel field effect transistor devices (NFET) which are connected so as to provide high speed, low power dissipation, integrated circuits for logic and memory applications. The abbreviation NFET is used herein to refer to an enhancement mode n-channel field effect transistor device. Such devices are generally fabricated by forming an N-type conductivity source diffusion and N-type drain diffusion in the surface of a P-type conductivity silicon substrate. The channel region of the substrate separating the source and drain regions, is covered by a gate insulator layer and a gate electrode. An enhancement mode NFET is normally non-conducting between its source and drain and it can be switched into conduction by applying a positive potential to its gate electrode, with respect to the potential of its source.

The abbreviation PFET will be used herein to refer to an enhancement mode p-channel field effect transistor device. Such devices are generally fabricated by forming P-type conductivity source diffusion and P-type conductivity drain diffusions within an N-type conductivity diffusion called an N-well which, in turn, has been formed in the P-type semiconductor substrate for the integrated circuit. The channel region of the N-well separating the P-type source and drain diffusions is covered by the gate insulator layer and the gate electrode. An enhancement mode PFET is normally non-conducting between a source and drain when the gate-to-source potential is relatively negative, the opposite condition from that obtaining from an NFET device relative to biasing.

In steady state operation, when the gate inputs are low (approximately 0 volts) the n-channel devices are turned off (non-conducting) and the p-channel devices are turned on (conducting). When the gate inputs are high (VDD) the n-channel devices are turned on and the p-channel devices are turned off.

SUMMARY OF THE INVENTION

In one embodiment, the present invention provides a single event upset (SEU) hardened integrated circuit. The integrated circuit includes an asymmetric bi-stable CMOS latch having a first logic state and a second logic state. A supply voltage is operably coupled to the asymmetric bi-stable latch, where upon activation of the supply voltage the asymmetric bi-stable latch is always set to the first logic state.

In one aspect, the asymmetric CMOS bi-stable latch includes a first CMOS inverter and a second CMOS inverter. The second CMOS inverter is cross-coupled to the first CMOS inverter, wherein the first CMOS inverter is asymmetric with the second CMOS inverter. The first CMOS inverter includes a first data node having a first nodal capacitance, and the second CMOS inverter includes a second data node having a second nodal capacitance different from the first nodal capacitance which defines the asymmetry between the first CMOS inverter and the second CMOS inverter.

The first CMOS inverter includes a first p-channel transistor and a first n-channel transistor. The second CMOS inverter includes a second p-channel transistor and a second n-channel transistor. The drain area of the first n-channel transistor is greater than the drain area of the second n-channel transistor. In one aspect, the drain area of the first n-channel transistor is more the four times the drain area of the second n-channel transistor.

In one embodiment, the SEU hardened asymmetric bi-stable CMOS latch includes an SEU hardening component. In one aspect, the SEU hardening component is a thin film resistor. In one aspect, the asymmetric bi-stable CMOS latch includes a first CMOS inverter and a second CMOS inverter. The second CMOS inverter is cross-coupled to the first CMOS inverter via a first coupling segment and a second coupling segment. The first CMOS inverter is asymmetric with the second CMOS inverter. The SEU hardening component is a thin film resistor positioned in the first coupling segment. Optionally, the SEU hardening component may be positioned in the first coupling segment, the second coupling segment, or both the first coupling segment and second coupling segment. Preferably, the thin film resistor is a polysilicon resistor.

The asymmetric bi-stable CMOS latch is reconfigurable between the first logic state and the second logic state, and may further include a switch for switching the asymmetric bi-stable CMOS latch between the first logic state and the second logic state. In one aspect, the switch includes an n-channel transistor. The latch further includes a pulsed input signal received by the n-channel transistor for switching the asymmetric bi-stable CMOS latch from the first logic state to the second logic state.

The latch may further include a reset coupled to the asymmetric bi-stable CMOS latch, wherein the reset operates to reset the asymmetric bi-stable latch to the first logic state.

In another embodiment, the present invention provides an SEU hardened bi-stable reconfigurable latch coupled to a supply voltage. The latch has a first logic state and a second logic state. The latch includes a first inverter including a first p-channel field effect transistor, a first n-channel field effect transistor, and a first data node located between the first p-channel transistor and the first n-channel transistor. A second inverter is provided including a second p-channel field effect transistor, a second n-channel field effect transistor and a second data node located between the second p-channel field effect transistor and the second n-channel field effect transistor. The first inverter is cross-coupled to the second inverter via a first coupling segment and a second coupling segment. The first p-channel field effect transistor is symmetric with the second p-channel field effect transistor. The first data node has a first nodal capacitance and the second data node has a second nodal capacitance asymmetric with the first nodal capacitance. An SEU hardening component is operably positioned within the latch. The first p-channel field effect transistor and the second p-channel field effect transistor each have a source coupled to the supply voltage, wherein upon activation of the supply voltage the latch is always set to the first logic state.

The latch may include a switch coupled across the second n-channel field effect transistor for selectively switching the latch between the first logic state and the second logic state. In one aspect, the switch includes a third n-channel field effect transistor. The switch is responsive to an input signal for switching the latch from the first logic state to the second logic state. In one aspect, the input signal is a pulse signal. The latch may further include a reset switch for selectively resetting the latch to the first logic state. In one aspect, the reset switch includes a fourth n-channel field effect transistor coupled across the first n-channel field effect transistor.

The SEU hardening component may be a thin film resistor. In one preferred application, the thin film resistor is an intracell polysilicon resistor.

The latch may further include an output data node defined by the first p-channel field effect transistor and the first n-channel field effect transistor each having a gate coupled together. The SEU hardening component includes a polysilicon resistor located in the second cross-coupled segment between the output data node and the second data node. In one application, the SEU hardening component preferably comprises a single thin film resistor.

The first n-channel field effect transistor includes a first drain area and the second n-channel field effect transistor includes a second drain area, wherein the first drain area is greater than the second drain area. In one aspect, a switch including a third field effect transistor is positioned across the second n-channel field effect transistor for selectively switching the latch between the first logic state and the second logic state. The first n-channel field effect transistor includes a first drain area, and the second n-channel field effect transistor includes a second drain area, and the third field effect transistor includes a third drain area, wherein the first drain area is greater than the sum of the second drain area and the third drain. In one aspect, the first drain area is more that twice the sum of the second drain area and the third drain area. In one aspect, the third field effect transistor is a third n-channel field effect transistor.

The first p-channel field effect transistor and the first n-channel field effect transistor each include a gate which are tied together defining a third data node. The second p-channel field effect transistor and the second n-channel field effect transistor each include a gate which are tied together to define a fourth data node. The first coupling segment is positioned between the first data node and the fourth data node. The second coupling segment is positioned between the third data node and the second data node. The SEU hardening component includes a thin film resistor located in the first coupling segment. The SEU hardening component may further include a thin film resistor located in the second coupling segment. Alternatively, the SEU hardening component includes a single thin film resistor in the second coupling segment.

In another embodiment, the present invention provides a bi-stable reconfigurable CMOS latch coupled to a supply voltage. The latch has a first logic state and a second logic state. The latch includes a first inverter including a first p-channel field effect transistor, a first n-channel field effect transistor, and a first data node located between the first p-channel filed effect transistor and the first n-channel field effect transistor. A second inverter is provided including a second p-channel field effect transistor, a second n-channel field effect transistor and a second data node located between the second p-channel field effect transistor and the second n-channel field effect transistor. The first inverter is cross-coupled to the second inverter via a first coupling segment and a second coupling segment. The first p-channel field effect transistor is symmetric with the second p-channel field effect transistor. The first data node has a first nodal capacitance and the second data node has a second nodal capacitance asymmetric with the first nodal capacitance. The first p-channel field effect transistor and the second p-channel field effect transistor each have a source coupled to the supply voltage, wherein upon application of the supply voltage of the latch is always set to the first logic state. A switch is coupled across the second n-channel field effect transistor for selectively switching the latch between the first logic state and the second logic state.

The switch may include a third n-channel field effect transistor. The switch is responsive to an input signal for switching the latch from the first logic state to the second logic state. The latch may further include a reset switch for selectively resetting the latch to the first logic state. The reset switch may include a fourth n-channel field effect transistor coupled across the first n-channel field effect transistor.

In another embodiment, the present invention provides a single event upset (SEU) hardened circuit. The circuit includes a critical path logic circuit portion. A non-critical path logic portion is provided including an SEU hardened asymmetric bi-stable CMOS latch having a first logic state and a second logic state including an SEU hardening component. A supply voltage is operably coupled to the asymmetric bi-stable latch, wherein upon activation of the supply voltage, the asymmetric bi-stable latch is always set to the first logic state.

In another embodiment, the present invention provides a field programmable gate array. The field programmable gate array includes a critical path logic circuit portion including an array of logical devices. A non-critical path logic circuit portion is provided including an asymmetric bi-stable CMOS latch having a first logic state and a second logic state. A supply voltage is operably coupled to the asymmetric bi-stable latch, wherein upon activation of the supply voltage the asymmetric bi-stable latch is always set to the first logic state.

The circuit asymmetric bi-stable CMOS latch further includes a first CMOS inverter and a second CMOS inverter cross-coupled to the first CMOS inverter. The first CMOS inverter is asymmetric with the second CMOS inverter.

The first CMOS inverter includes a first data node having a first nodal capacitance, and a second CMOS inverter includes a second data node having a second nodal capacitance different from the first nodal capacitance which defines the asymmetry between the first CMOS inverter and the second CMOS inverter. In one aspect, the first CMOS inverter includes a first p-channel transistor and a first n-channel transistor, and the second CMOS inverter includes a second p-channel transistor and a second n-channel transistor, wherein the drain area of the first n-channel transistor is greater than the drain area of the second n-channel transistor. In one aspect, the asymmetric bi-stable CMOS latch is SEU hardened.

In one aspect, the asymmetric bi-stable CMOS latch includes a first CMOS inverter and a second CMOS inverter. The second CMOS inverter is cross-coupled to the first CMOS inverter by a first coupling segment and a second coupling segment. The first CMOS inverter is asymmetric with the second CMOS inverter. The asymmetric bi-stable CMOS latch includes an SEU hardening component, wherein the SEU hardening component is a resistor positioned in the first coupling segment.

The array of logical devices may include a first logic device, and further wherein the asymmetric bi-stable latch is operably coupled to the first logic device for controlling activation of the first logic device.

In another embodiment, the present invention provides a power failure detector. The power failure detector includes an asymmetric bi-stable CMOS latch having a first logic state and a second logic state. A supply voltage is operably coupled to the asymmetric bi-stable latch, wherein upon application of the supply voltage to the asymmetric bi-stable CMOS latch is always set to the first logic state. A switch is operably coupled to the asymmetric bi-stable CMOS latch for changing the asymmetric bi-stable CMOS latch from the first logic state to the second logic state. Upon loss of the supply voltage and subsequent restoration of the supply voltage the asymmetric bi-stable latch returns to the first logic state to indicate that a loss of supply voltage has occurred.

The asymmetric bi-stable latch may further comprise a first CMOS inverter and a second CMOS inverter. The second CMOS inverter is cross-coupled to the first CMOS inverter. The first CMOS inverter is asymmetric with the second CMOS inverter.

The first CMOS inverter includes a first data node having a first nodal capacitance. The second CMOS inverter includes a second data node having a second nodal capacitance different from the first nodal capacitance which defines the asymmetry between the first CMOS inverter and the second CMOS inverter.

The symmetric bi-stable CMOS latch may further include a first inverter including a first p-channel field effect transistor, a first n-channel field effect transistor and a first data node located between the first p-channel field effect transistor and the first n-channel field effect transistor. A second inverter is provided including a second p-channel field effect transistor, a second n-channel field effect transistor and a second data node located between the second p-channel field transistor and the second n-channel field effect transistor. The first inverter is cross-coupled to the second inverter via a first coupling segment and a second coupling segment. The first p-channel field effect transistor is symmetric with the second p-channel field effect transistor. The first data node has a first nodal capacitance and the second data node has a second nodal capacitance asymmetric with the first nodal capacitance. The first p-channel field effect transistor and the second p-channel field effect transistor each have a source coupled to the supply voltage, wherein upon application of the supply voltage the latch is always set to the first logic state. The switch is coupled across the second n-channel field effect transistor for selectively switching the latch between the first logic state and the second logic state.

In one aspect, the switch includes a third n-channel field effect transistor. The switch is responsive to an input signal for switching the latch from the first logic state to the second logic state. The latch may further include a reset switch coupled between the first node and ground for selectively resetting the latch to the first logic state. The reset switch may include a fourth n-channel field effect transistor. In one preferred aspect, the first n-channel transistor has a drain area which is greater than the drain area of the second n-channel transistor.

In one aspect, the asymmetric bi-stable CMOS latch is SEU hardened. The asymmetric bi-stable CMOS latch includes an SEU hardening component.

In another embodiment, the present invention provides a method of operating a field programmable gate array. The method includes the step of defining a critical path logic circuit portion including an array of logic devices. A non-critical path logic circuit portion is defined including an asymmetric bi-stable CMOS latch having a first logic state and a second logic state. A supply voltage coupled to the asymmetric bi-stable latch is activated, to set the asymmetric bi-stable latch to the first logic state.

In one aspect, the method includes the step of defining the asymmetric bi-stable CMOS latch to include a first CMOS inverter and a second CMOS inverter cross-coupled to the first CMOS inverter. The first CMOS inverter is asymmetric with the second CMOS inverter. The method may further include the step of defining the first CMOS inverter to include a first data node having a first nodal capacitance, and the second CMOS inverter to include a second data node having a second nodal capacitance different from the first nodal capacitance which defines the asymmetry between the first CMOS inverter and the second CMOS inverter. The method further includes the step of defining the first CMOS inverter to include a first p-channel transistor and a first n-channel transistor, and the second CMOS inverter to include a second p-channel transistor and a second n-channel transistor, wherein the drain area of the first n-channel transistor is greater than the drain area of the second n-channel transistor.

In one aspect, the method includes the step of defining the asymmetric bi-stable CMOS latch as SEU hardened. The method may further include the step of defining the asymmetric CMOS bi-stable latch to include a first CMOS inverter, a second CMOS inverter cross-coupled to the first CMOS inverter by a first coupling segment and a second coupling segment, wherein the first CMOS inverter is asymmetric with the second CMOS inverter. The asymmetric bi-stable CMOS latch includes an SEU hardening component wherein the SEU hardening component includes positioning a thin film resistor in the first coupling segment.

The method may further include the step of reconfiguring the asymmetric CMOS bi-stable latch between the first logic state and the second logic state via a switch operably coupled to the asymmetric CMOS bi-stable latch. The switch may be defined to include an n-channel transistor. The method may further include the step of receiving a pulsed input signal by the n-channel transistor for switching the asymmetric bi-stable latch between the first logic state and the second logic state. The method may further include the step of resetting the asymmetric CMOS bi-stable latch to the first logic state via a reset switch operably coupled to the asymmetric CMOS bi-stable latch.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
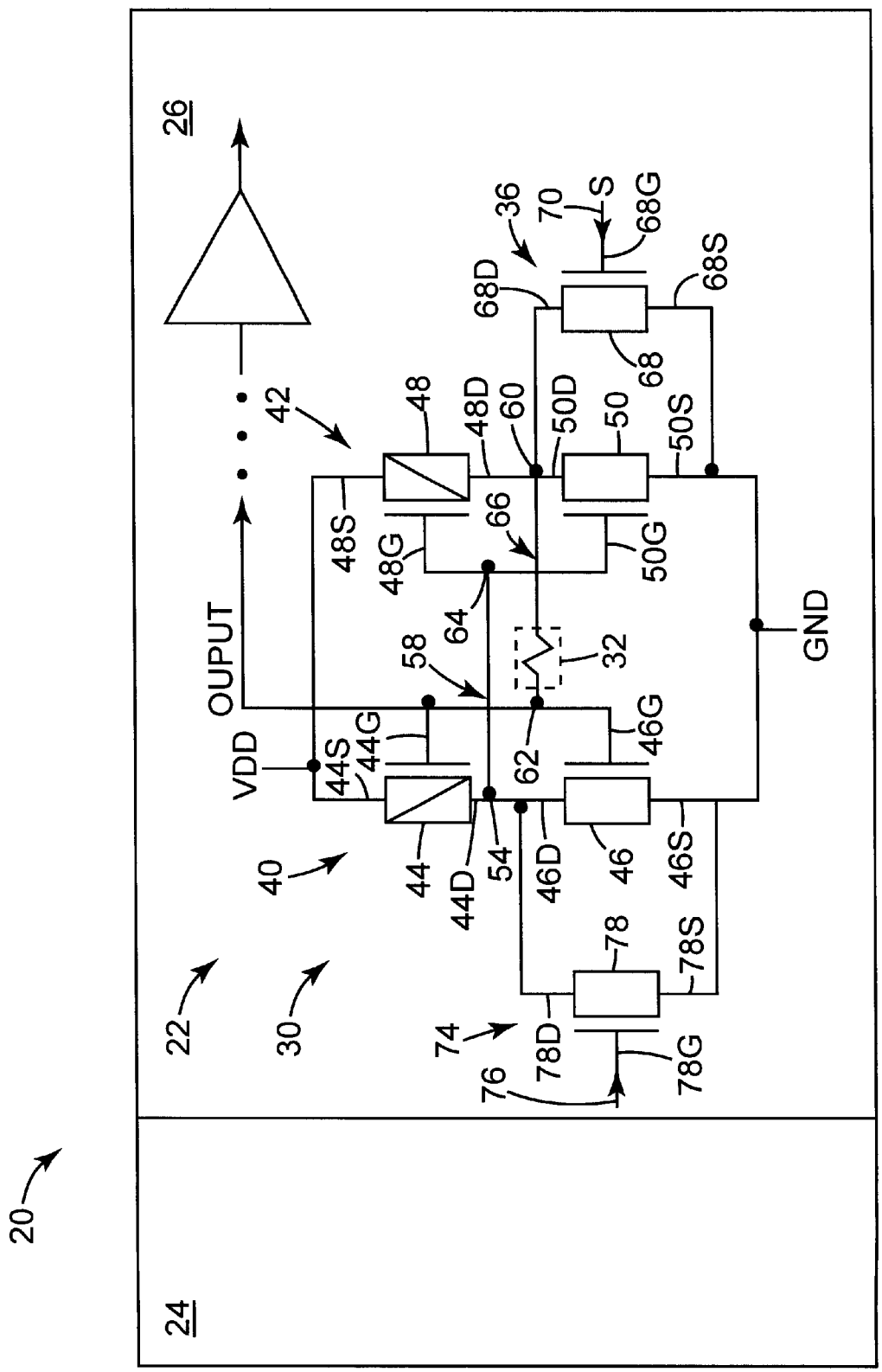
FIG. 1 is a schematic diagram illustrating one exemplary embodiment of an SEU hardened integrated circuit in accordance with the present invention, including an SEU hardened, reconfigurable bi-stable CMOS latch.

In FIG. 1, an SEU hardened integrated circuit 20 including an SEU hardened bi-stable CMOS latch 22 in accordance with the present invention is shown. The SEU hardened latch 22 is suitable for use in complex reconfigurable integrated circuits including applications requiring immunity to intense heavy ions strikes, such as space and military applications. The integrated circuit 20 may have a critical path logic circuit portion 24 and a non-critical path logic circuit portion 26. For example, critical path logic circuit portion 24 may include circuitry in the critical signal path and non-critical path logic circuit portion 24 may include control lines located outside of the critical signal path. Latch 22 can be part of an array of connected and unconnected logic elements which may include programmable and reconfigurable (or "reprogrammable") logic circuits, (e.g., a field programmable gate array). The circuit portions 24, 26 may include other integrated circuit components (e.g., data latches, SRAM cells, etc.).

Preferably, latch 22 is a reconfigurable latch and includes an asymmetric bi-stable CMOS latch 30 having a first logic state and a second logic state. In one embodiment, the latch 30 is SEU hardened (e.g., via an SEU hardening process), and preferably includes an SEU hardening component 32. A supply voltage VDD is operably coupled to the asymmetric bi-stable latch 30, wherein upon application of the supply voltage VDD (e.g., 2.5 volts, 3.3 volts, 5 volts) the asymmetric bi-stable latch is always set to the first logic state (i.e., a predetermined state) due to the asymmetric characteristics of the latch. The SEU hardened reconfigurable bi-stable CMOS latch 22 is described in detail in the following paragraphs.

In one preferred embodiment, the reconfigurable latch 22 includes asymmetric bi-stable CMOS latch 30, the SEU hardening component 32, and switch 36. Switch 36 is provided to switch the latch 22 between the first logic state and the second logic state and in one preferred application, from the first logic state to the second logic state.

The asymmetric CMOS bi-stable latch 30 includes a first CMOS inverter 40 and a second CMOS inverter 42. The second CMOS inverter 42 is cross-coupled to the first CMOS inverter 40, wherein the first CMOS inverter 40 is asymmetric with the second CMOS inverter 42.

First CMOS inverter 40 include a p-channel enhancement mode MOSFET PFET 44 and an n-channel enhancement mode MOSFET NFET 46. Similarly, second CMOS inverter 42 includes a p-channel enhancement mode MOSFET PFET 48 and a n-channel enhancement mode MOSFET NFET 50. Each PFET 44, PFET 48, NFET 46, NFET 50 include a gate, drain, and source as known in the art, correspondingly indicated as gates 44G, 46G, 48G and 50G; drains 44D, 46D, 48D and 50D; and sources 44S, 46S, 48S and 50S. The drain and source regions are substantially similar, and may be referred to as drain/source nodes or regions. The PFET 44 and PFET 48 sources 44S, 48S are tied to supply voltage VDD. The PFETs are built in an n-well and this n-well represents their body (B) node (not shown). The n-well is biased at VDD. The NFET 46 and NFET 50 sources 46S, 50S are coupled to circuit ground GND. The NFETs are built in a p-substrate and this p-substrate represents their body (B) node (not shown). The p-substrate is grounded. The drain 44D of PFET 44 is tied to NFET 46 drain 46D at data node 54. The gate 48G of PFET 48 and the gate 50G of NFET 50 (at data node 64) are also tied to data node 54 via cross-coupling segment 58. The drain 48D of PFET 48 is coupled to the drain 50D of NFET 50 at data node 60. The gate 44G of PFET 44 is coupled to the gate 46G of NFET 46 at output data node 62. Further, at cross-coupling segment 66, data node 60 is coupled to data node 62 through SEU hardening component 32.

Switch 36 is operably coupled to latch 30 across NFET 50. In one embodiment shown, switch 36 is an n-channel MOSFET and includes NFET 68 having gate 68G, drain 68D, Source 68S and grounded body $B_5$ (not shown). Gate 68G is coupled to receive a switch input signal 70 to switch latch 30 from a first state to a second state. Drain 68D is coupled to data node 60, and source 68S is coupled to ground GND.

Figure 2:
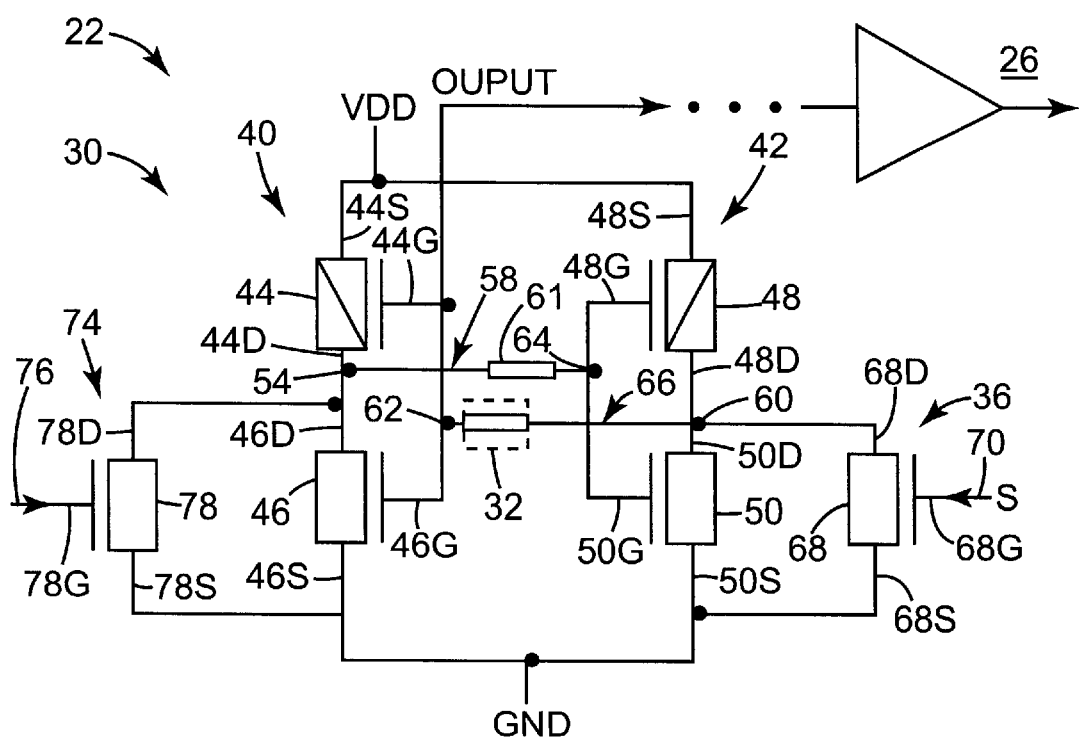
FIG. 2 is a schematic diagram illustrating another exemplary embodiment of an SEU hardened integrated circuit in accordance with the present invention.

In one preferred embodiment, the SEU hardening component 32 is a thin film resistor, and more preferably, is an intracell polysilicon resistor. Preferably, a single resistor R1 is placed in only one cross-coupling segment 52 for optimizing protection against single-event upsets, while maintaining design performance due to the capacitive asymmetry of the latch and minimizing the number of circuit components (i.e., "circuit overhead"). As such, R1 in only one cross-coupling segment S2 adds to the asymmetry of the latch 22. In reference to FIG. 2, it is recognized that SEU hardening components may be located at other positions within latch 22, such as SEU hardening component 61 shown positioned in cross-coupling segment 58. Other SEU hardening techniques or SEU hardening components and locations for other SEU hardening components may become apparent to those skilled in the art after reading the disclosure of the present application.

Due to the asymmetry of SEU hardened latch 22 it always sets to a predetermined logic (or data) state after power-up. In one preferred embodiment, the latch 22 is designed such that NFET 46 has a total drain area which is greater than NFET 50, and preferably at least twice the total drain area of NFET 50 and NFET 68. This latch design capacitance asymmetry ensures that data node 60 charges faster than data node 54, resulting in a logic high at data node 60 and causing a logic low at data node 54 at power-up. At a minimum, it is desired that the difference in nodal capacitance be great enough such that the latch 22 always powers-up to a known (i.e., predetermined) logic state.

Data latch 22 is reconfigurable, and in response to an input signal 70 may be changed to an inverse logic state. A reset can be used to uniformly reset the data latch 22 to its default, post power-up logic state. In one preferred embodiment, reset switch 74 is operably coupled to latch 30 across NFET 46. Latch 22 is reset via a reset input signal 76 to the reset switch 74. In one preferred embodiment, reset switch 74 is an n-channel MOSFET and includes NFET 78 having gate 78G, drain 78D and source 78S. Drain 78D is coupled to data node 54, and source 78S is coupled to ground GND. Gate 78G is coupled to receive reset input signal 76. Upon receipt of reset input signal 76 via gate 78G, NFET 78 is conducting and operates to momentarily pull node 54 to ground GND resulting in the resetting of latch 22 upon subsequent restoration of power.

In operation, after power-up latch 22 is set to a predetermined logic state. In the exemplary embodiment shown, the first logic state includes a logic low at node 54 (0) and a logic high at node 60 (1). Upon receipt of a "set" input signal 70, latch 22 changes from the first logic state to a second logic state, resulting in a logic high (1) at node 54 and a logic low (0) at node 60. Upon operation of a reset via receipt of a reset input signal 76, the latch 22 is reset to the first logic state. The operation of latch 22 between a first logic state and a second logic state is described in further detail in the following paragraphs and in reference to FIGS. 3–7, and FIGS. 1 and 2 previously detailed herein.

Figure 3:
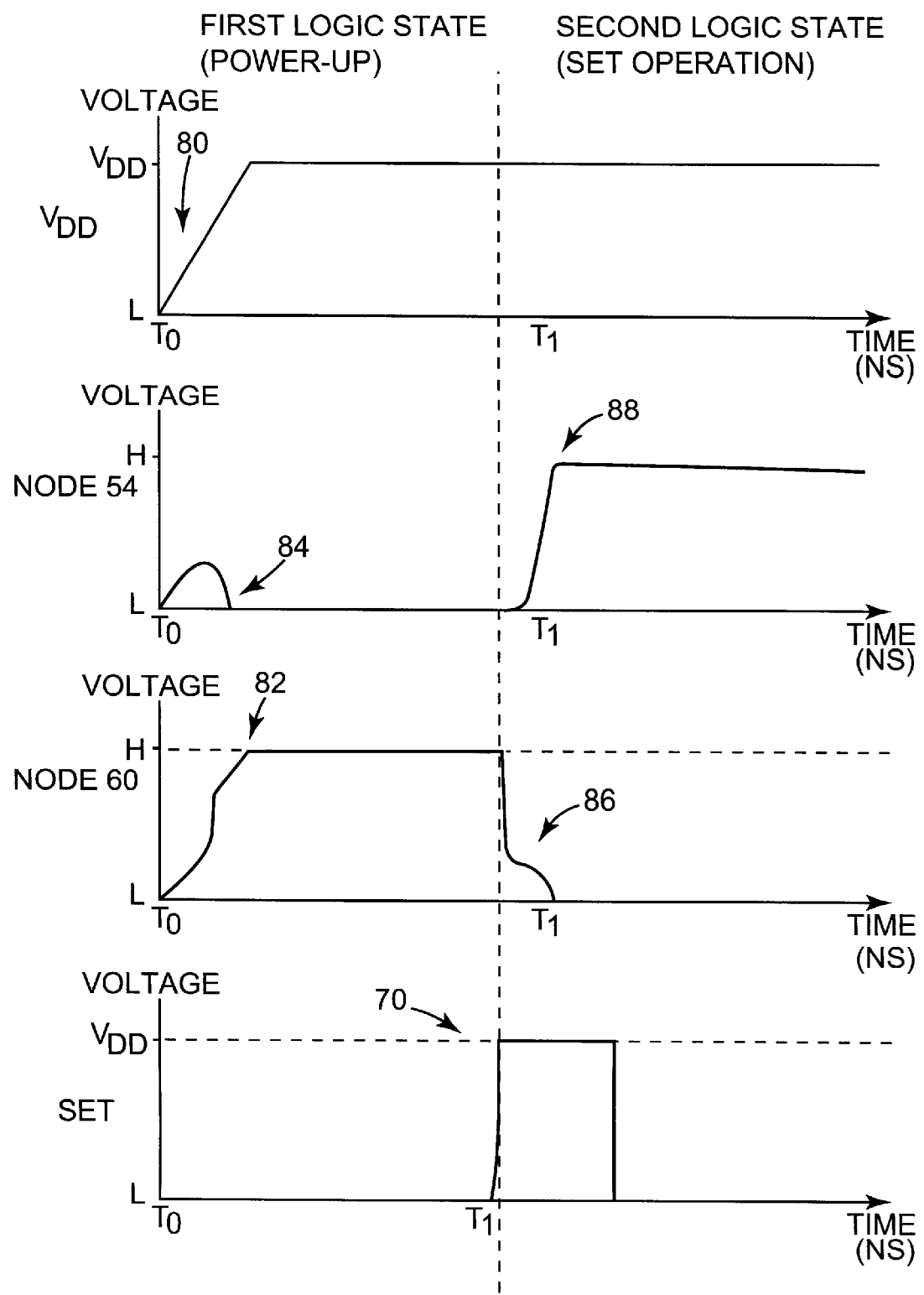
FIG. 3 illustrates timing diagrams for respective data nodes during a first logic state and a second logic state of the SEU hardened reconfigurable bi-stable CMOS latch in accordance with the present invention.

In FIG. 3 timing diagrams are shown illustrating supply voltage VDD, data node 54, data node 60, and input signal 70 (SET) as the data latch 22 is operated between a first logic state and a second logic state.

The design of the data latch is purposely asymmetric, particularly with respect to the nodal capacitances at data node 54 and data node 60 or the opposite sides of the data latch 22. This asymmetry is to ensure that the latch consistently sets in an expected, predetermined data state at power-up. In this application, "power-up" is the act of applying supply voltage VDD to the data latch circuit (i.e., the value of VDD goes from 0 volts to its normal operation voltage level (e.g., 5 volts, 3.3 volts, 2.5 volts . . . )).

Prior to power-up, all nodes in data latch 22 (e.g., 54, 60, 62) are at ground (0 volts) indicated at $T_0$. At power-up, supply voltage VDD is applied to energize the data latch 22. At the instant that VDD begins to rise in voltage (indicated at 80) PFET 44 and PFET 48 are both turned on and begin to conduct. PFET 44 and PFET 48 attempt to charge their respective data nodes 54 and 60 at the same time. Since devices PFET 44 and PFET 48 are equal in design, the circuit node (54 or 60) that charges up in potential faster to establish the logic state of the data latch 22 is the node with the smaller total nodal capacitance. The greatest contributors to nodal capacitance during a power-up operation are the pn junction capacitances (as opposed to oxide capacitances), since pn junctions have relatively large zero-bias specific capacitance at the start of the power-up cycle. Further, generally for VLSI/ULSI designs, the overall total area of the pn junctions associated with the device drain regions and well regions is much larger than the total area of the active gate regions. In the exemplary embodiment shown, node 60 has a smaller total nodal capacitance than node 54, and as such charges up in potential faster, indicated at 82, 84.

Latch 22 can be selectively reconfigured (i.e., changed from the first logic state to the second logic state). At time equals $T_1$, a "SET" pulsed input signal 70 is selectively applied to the data latch 22 at gate 68G of NFET 68. In response to the pulsed input signal 70, NFET 68 will turn on (i.e., in a conduction mode) and pull data node 60 low (i.e., to ground GND). This results in changing the data state of the latch 22 from a post power-up state (wherein data node 54 is low and data node 60 is high) to the inverse data state wherein data node 54 is high and data node 60 is low, indicated at 86, 88. In one preferred embodiment, the width of the set pulse is a few hundred nanoseconds.

The data latch 22 can be uniformly reset to the default post-power-up data state wherein data node 54 is low and data node 60 is high by performing a (momentary) reset using reset switch 74. In a reset operation, the voltage level at node 54 is momentarily reduced to 0 volts, and then returned to its normal operational voltage level. Upon power-up after a reset operation, latch 22 is set to its predetermined, post power-up state as previously detailed herein.

The unique data latch 22 in accordance with the present invention can be SEU immune. In one preferred embodiment, SEU hardening component 32 is a polysilicon intracell resistor which augments the total nodal capacitances of the design to slow the RC time constant of the regenerative feedback response to heavy ion strikes to the SEU sensitive regions of the bi-stable latch 22. Further, the resistor, when placed in only one cross-coupling segment 52 of the cross-coupled feedback, is more effective in protecting against upsets given the design capacitive asymmetry of the latch. Data latch 22 preferably is not positioned in a critical signal path. Thus, the capacitance and resistance added to the data latch 22 in the present design to ensure proper operation and enhance SEU or radiation hardness does not negatively impact the performance of the digital logic circuit. Preferably, latch 22 is manufactured using a radiation hardened (RAD HARD) process as known to those skilled in the art to further ensure a predictable, SEU hardened reconfigurable bi-stable CMOS latch.

Data Latch Simulation Results

Circuit simulations were performed on data latch 22 described herein, including operation at worst case conditions. Simulations where performed on the data latch 22 across the military temperature range (including accounting for the negative temperature coefficient of polysilicon resistors, and with design and an operation skews). A summary of the simulation results is provided below and illustrated in the graphs of FIGS. 4–7. The data latch 22 included a 3.3 volt, 0.5 micrometer CMOS process technology. The data latch simulation design parameters are as follows:

TABLE I

| Device | Design |
| --- | --- |
| PFET 44 | W = 8.0 µm; L = 0.5 µm |
| PFET 48 | W = 8.0 µm; L = 0.5 µm |
| NFET 46 | W = 4.0 µm; L = 0.5 µm |
| NFET 50 | W = 4.0 µm; L = 0.5 µm |
| NFET 68 | W = 4.0 µm; L = 0.5 µm |
| R1 | 600 KΩ @ 125° C. |

PFET 44 and PFET 48 were defined with widths twice as large as the widths of NFET 46, NFET 50, and NFET 68 to compensate for the lower channel mobility of a p-channel device as compared to an n-channel device. Also, the pn junction drain region area of device NFET 46 was defined as having twice the total drain area of devices NFET 50 and NFET 68 to ensure a desired, predictable logic state at start-up. It was recognized that the value of R1 may vary with technology, and may be lower or higher than 600 kilo-ohms.

Figure 4:
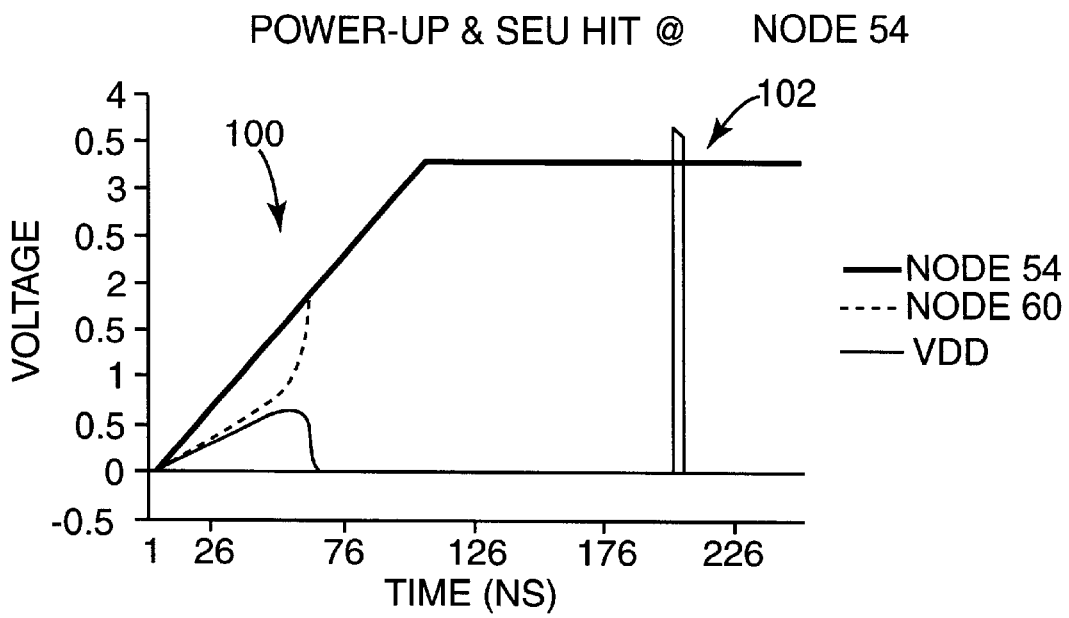
FIG. 4 is a graph illustrating one exemplary embodiment of a simulation SEU hit at a data node of an SEU hardened reconfigurable bi-stable CMOS latch in accordance with the present invention.
Figure 5:
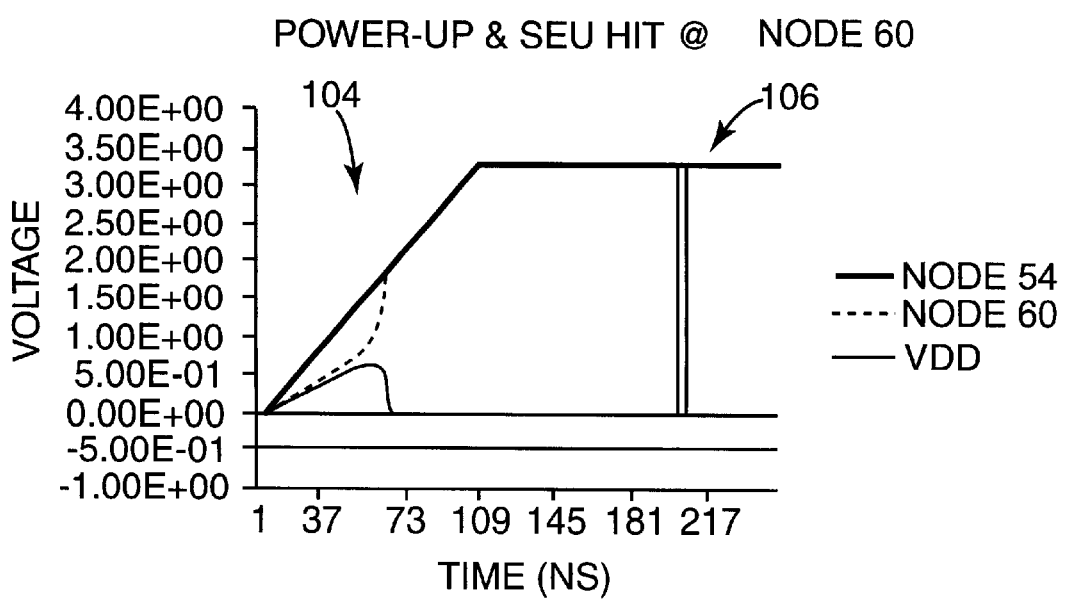
FIG. 5 is a graph illustrating one exemplary embodiment of a simulation SEU hit at a data node of an SEU hardened reconfigurable bi-stable CMOS latch in accordance with the present invention.
Figure 6:
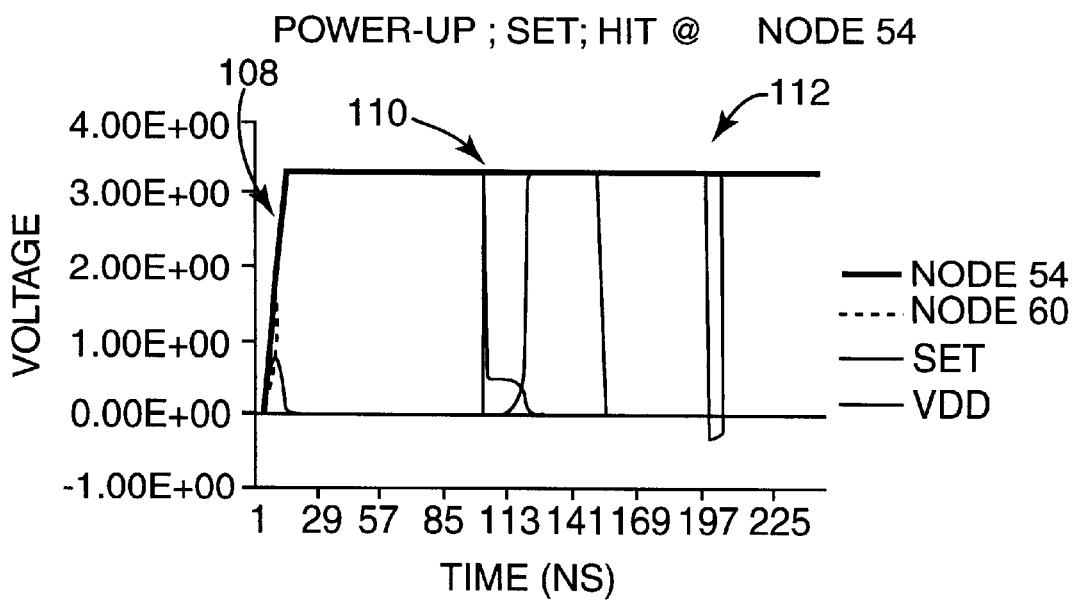
FIG. 6 is a graph illustrating one exemplary embodiment of a simulation SEU hit at a data node of an SEU hardened reconfigurable bi-stable CMOS latch in accordance with the present invention.
Figure 7:
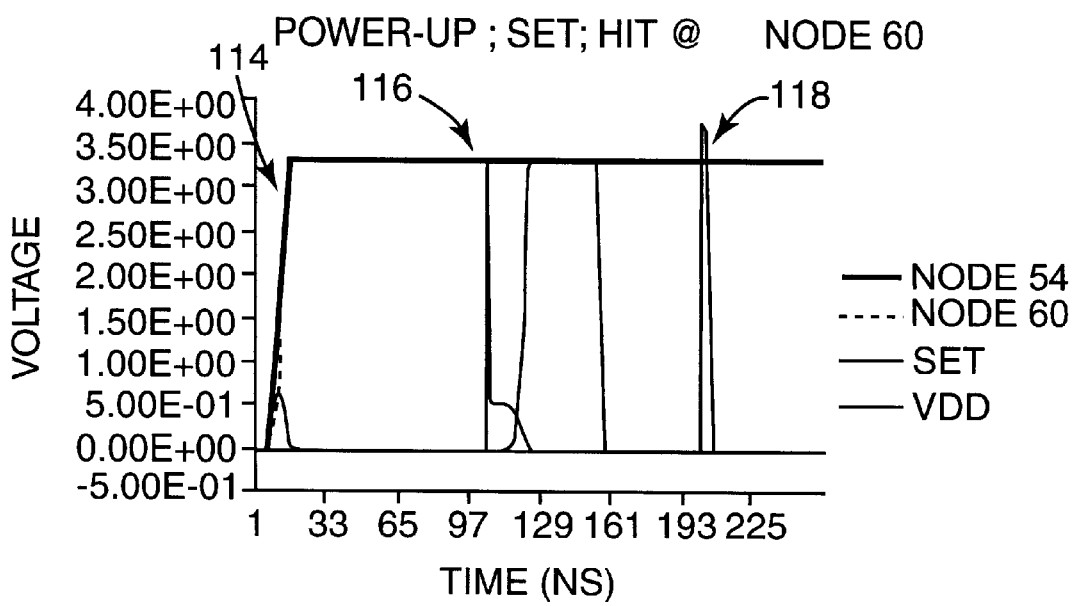
FIG. 7 is a graph illustrating one exemplary embodiment of a simulation SEU hit at a data node of an SEU hardened reconfigurable bi-stable CMOS latch in accordance with the present invention.

FIGS. 4–7 illustrate graphed simulation results after a large SEU hit of 3.0 pC to data nodes 54, 60 in data latch 22. In particular, FIG. 4 shows the simulation results of a power-up operation (at 100), and then an SEU hit to data node 54 (indicated at 102). FIG. 5 illustrates the simulation results of a power-up operation (at 104) followed by an SEU hit to data node 60 (at 106). FIG. 6 illustrates the simulation results of a power-up operation (at 108); a SET operation (at 110); and then a SEU hit to data node 54 (at 112). FIG. 7 illustrates the simulation results of a power-up operation (at 114), a SET operation (at 116), and an SEU hit to data node 60 (at 118). In each of these simulations shown in FIGS. 4–7, no SEU upset (i.e., change in logic state) occurred even after the large simulated SEU hit of 3.0 pC.

The latch 22 had broad applications and uses. The data latch 22 design in accordance with the present invention will enable the design, fabrication and use of complex reconfigurable logic circuits for all applications, including space and military applications where SEU hardened requirements are most stringent.

In one aspect, latch 22 is used as a power loss or power failure detector. For example (and in reference again to FIG. 1), after power-up of the integrated circuit 20, latch 22 is set to a predetermined logic state, such as a first logic state which includes a logic low at node 54 (0) and a logic high at node 60 (1). After power-up, the latch 22 is set to a power failure detection mode by providing a "SET" input signal 70 to switch 36 via gate 68G. Upon receipt of the input signal 70, latch 22 changes from the known, first logic state to a second logic state, resulting in a logic high (1) at node 54 and a logic low (0) at node 60. The latch 22 is maintained in its power failure detection mode state. If a power failure occurs, upon restoration of power the latch again defaults to the first logic state. A subsequent polling of the state of the latch at either node 54 or node 60 would indicate that a change in logic state has occurred, indicating that the integrated circuit 22 has experienced a loss of power. Other applications for the reconfigurable bi-stable data latch 22 as a power loss or power failure detector will become apparent to those skilled in the art after reading the present application. Further, the reconfigurable bi-stable latch used as a power loss or power failure detector may or may not be required to be SEU hardened depending on the specific application.

Figure 8:
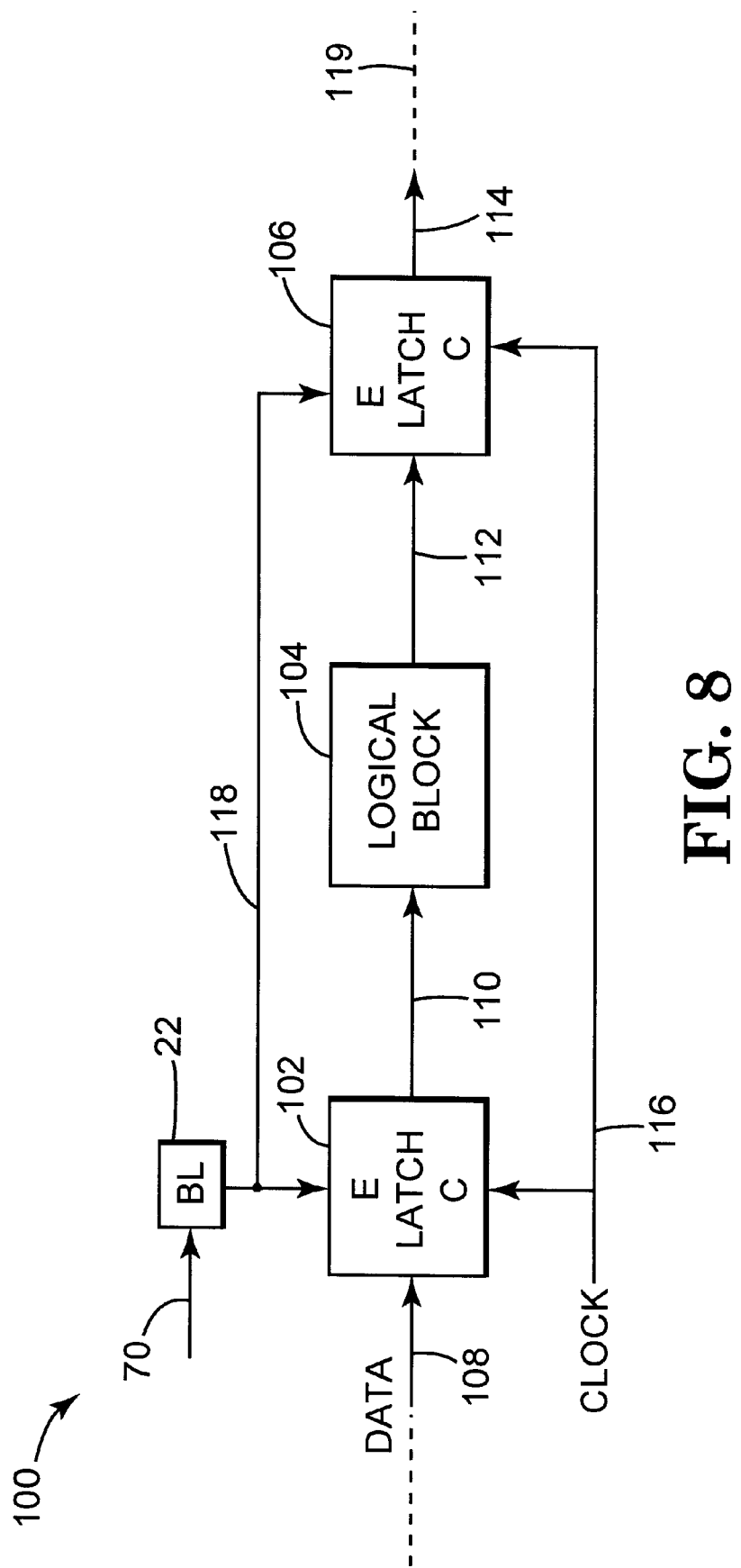
FIG. 8 is a block diagram illustrating one exemplary embodiment of using a latch in accordance with the present invention.

In FIG. 8, one application of the use of bilateral latch 22 is illustrated at 100. The block diagram 100 includes data latch 102, logic block 104, data latch 106, data signal 108, latch data output signal 110, logical block output signal 112, latch output signal 114, clock 116 and output signal enable 118. Upon receipt of input signal 70, bi-lateral latch 22 changes state to provide an output signal enable 118 to latch 102 and latch 106. Upon enabling of latch 102 and latch 106 the respective data latches are toggled, data signal 108 is clocked through latch 102 at the rate of clock signal 116, and received by logical block 104 via latch data output signal 110. At logical block 104, a logical operation may be performed on data signal 110, resulting in logical block output signal 112. The logical block output signal 104 is output at 114, via latch 106. Although bilateral latch 22 is not located within the critical signal path 116, the reconfigurable latch 22 provides a control output (i.e., output signal enable 118) to latch 102 and latch 106 positioned along the critical signal path 119.

Figure 9:
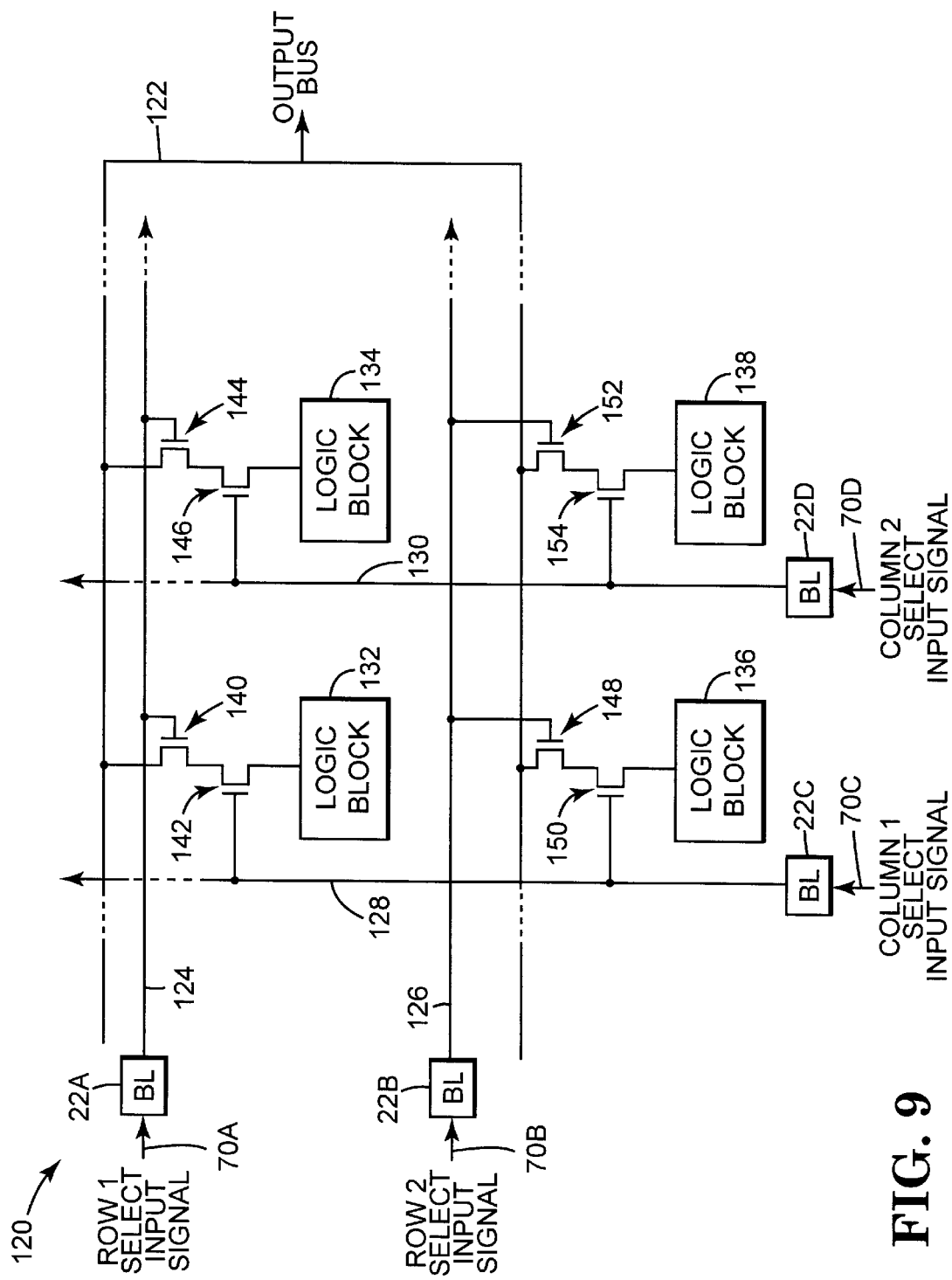
FIG. 9 is a block diagram illustrating one exemplary embodiment of a field programmable gate array including a reconfigurable bi-stable CMOS latch, in accordance with the present invention.

In FIG. 9, a field programmable gate array (FPGA) including a bi-stable latch in accordance with the present invention is generally indicated at 120. The bi-stable latches 22 (indicated as 22A, 22B, 22C, 22D and also labeled BL) are located outside of a critical signal path, but are used to control switches located in a critical signal path. In the exemplary embodiment shown, the reconfigurable features of latch 22 are utilized to selectively combine the desired outputs of an array of logic blocks.

In the exemplary embodiment shown, FPGA 120 includes latches 22A, 22B, 22C and 22D, capable of receiving input signals 70A, 70B, 70C, 70D. FPGA 120 further includes output signal bus 122, row select lines 124, 126, column select lines 128, 130, and logic blocks 132, 134, 136, 138. Logic block 132 is coupled to output bus 122 via row select transistor 140 and column select transistor 142; logic block 134 is coupled to output bus 122 via row select transistor 144 and column select transistor 146; logic block 136 is coupled to the output bus 122 via row select transistor 148 and column select transistor 150; and logic block 138 is coupled to output bus 122 via row select transistor 152 and column select transistor 154.

In operation, the logic blocks 132, 134, 136, 138 can be selectively coupled to output bus 122 by activation of corresponding row select lines 124, 126 and column select lines 128, 130 via latches 22A, 22B, 22C, 22D. For example, by providing row 1 select input signal 70A to latch 22 (to switch the latch state) and column 2 select input signal 70D to latch 22D, row select line 124 and column select line 130 are activated to provide the output of logic block 134 to output bus 122 via conducting row select transistor 140 and column select transistor 142. In a similar manner, by also providing row 2 select input signals 70B to latch 22B, the output of logic block 138 is likewise output to output bus 122. Other applications for the latch 22 for use in the non-critical paths in field programmable gate arrays will become apparent to those skilled in the art after reading the disclosure of the present application.

Figure 10:
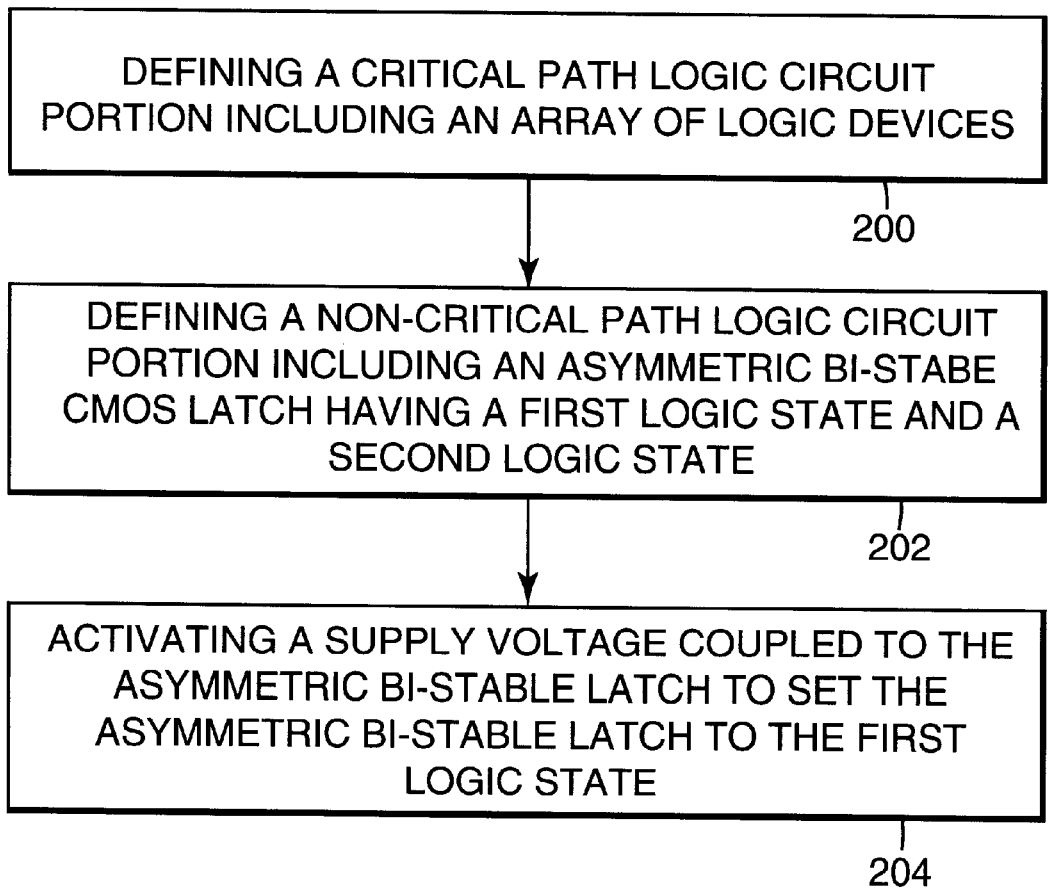
FIG. 10 is a flow diagram illustrating one exemplary method of operating a field programmable gate array in accordance with the present invention.

In FIG. 10, a flow diagram illustrating one exemplary embodiment of a method of operating a field programmable gate array in accordance with the present invention is generally shown. At step 200, a critical path logic circuit portion is defined including an array of logic devices. At step 202, a non-critical path logic portion is defined including an asymmetric bi-stable CMOS latch having a first logic state and a second logic state. The asymmetric bi-stable CMOS latch may be further defined to include a first CMOS inverter and a second CMOS inverter cross-coupled to the first CMOS inverter, wherein the first CMOS inverter is asymmetric with the second CMOS inverter. The first CMOS inverter includes a first data node having a first nodal capacitance, and the second CMOS inverter includes a second data node having a second nodal capacitance different from the first nodal capacitance which defines the asymmetry between the first CMOS inverter and the second CMOS inverter. In one aspect, the first CMOS inverter includes a first p-channel transistor and a first n-channel transistor, and the second CMOS inverter includes a second p-channel transistor and a second n-channel transistor, wherein the drain area of the first n-channel transistor is greater than the drain area of the second n-channel transistor. In one aspect, the asymmetric bi-stable CMOS latch can be SEU hardened. In one embodiment, the asymmetric bi-stable latch is defined to include a first CMOS inverter, and a second CMOS inverter cross-coupled to the first CMOS inverter by a first coupling segment. The first CMOS inverter is asymmetric with the second CMOS inverter. The asymmetric bi-stable CMOS latch includes an SEU hardening component, where in one embodiment the SEU hardening component includes positioning a thin film resistor in the first coupling segment.

At step 204, a supply voltage coupled to the asymmetric bi-stable latch is activated to set the asymmetric bi-stable latch to the first logic state (i.e., a predetermined state at power-up). The asymmetric CMOS bi-stable latch can be reconfigured between the first logic state and the second logic state via a switch operably coupled to the asymmetric CMOS bi-stable latch. In one aspect, the switch is defined as including an n-channel transistor. The n-channel transistor is capable of receiving a pulsed input signal for switching the asymmetric bi-stable latch between the first logic state and the second logic state. The asymmetric CMOS bi-stable latch can be reset to the first logic state via a reset switch operably coupled to the asymmetric CMOS bi-stable latch.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the electrical, mechanical and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A single event upset (SEU) hardened integrated circuit comprising:
    an SEU hardened asymmetric bi-stable CMOS latch having a first logic state and a second logic state, the latch comprising:
        a first CMOS inverter including a first p-channel field effect transistor, a first n-channel field effect transistor, and a first data node located between the first p-channel transistor and the first n-channel transistor;
        a second CMOS inverter including a second p-channel field effect transistor, a second n-channel field effect transistor and a second data node located between the second p-channel field effect transistor and the second n-channel field effect transistor, wherein the first CMOS inverter is cross-coupled to the second CMOS inverter via a first coupling segment and a second coupling segment, wherein the first coupling segment and the second coupling segment are not within the first CMOS inverter and the second CMOS inverter, wherein the first p-channel field effect transistor is symmetric with the second p-channel field effect transistor, and wherein the drain area of the first n-channel transistor is greater than the drain area of the second n-channel transistor resulting in the first data node having a first nodal capacitance and the second data node having a second nodal capacitance asymmetric with the first nodal capacitance;
        an SEU hardening component operably positioned within the first coupling segment or the second coupling segment of the latch, wherein the SEU hardening component is a thin film resistor; and
        a supply voltage operably coupled to the asymmetric bi-stable latch, wherein upon activation of the supply voltage the asymmetric bi-stable latch is always set to the first logic state.

2. The circuit of claim 1, wherein the drain area of the first n-channel transistor is more than four times the drain area of the second n-channel transistor.

3. The circuit of claim 1, wherein the thin film resistor is a polysilicon resistor.

4. The circuit of claim 1, wherein the latch is reconfigurable between the first logic state and the second logic state, further comprising a switch for switching the asymmetric bi-stable CMOS latch between the first logic state and the second logic state.

5. The circuit of claim 4, wherein the switch includes an n-channel transistor.

6. The circuit of claim 4, further comprising a pulsed input signal received by the n-channel transistor for switching the asymetric bi-stable CMOS latch from the first logic state to the second logic state.

7. The circuit of claim 1, further comprising a reset coupled to the asymmetric bi-stable CMOS latch, wherein the reset operates to reset the asymmetric bi-stable CMOS latch to the first logic state.

8. An SEU hardened bi-stable reconfigurable latch coupled to a supply voltage having a first logic state and a second logic state, the latch comprising:
- a first inverter including a first p-channel field effect transistor, a first n-channel field effect transistor, and a first data node located between the first p-channel transistor and the first n-channel transistor;
- a second inverter including a second p-channel field effect transistor, a second n-channel field effect transistor and a second data node located between the second p-channel field effect transistor and the second n-channel field effect transistor, wherein the first inverter is cross-coupled to the second inverter via a first coupling segment and a second coupling segment, wherein the first coupling segment and the second coupling segment are not within the first inverter and the second inverter, wherein the first p-channel field effect transistor is symmetric with the second p-channel field effect transistor, and wherein the first n-channel field effect transistor includes a first drain area and the second n-channel field effect transistor includes a second drain area, wherein the first drain area is greater than the second drain area resulting in the first data node having a first nodal capacitance and the second data node having a second nodal capacitance asymmetric with the first nodal capacitance;
- an SEU hardening component operably positioned within the first coupling segment or the second coupling segment of the latch, wherein the SEU hardening component is a thin film resistor; and
- wherein the first p-channel field effect transistor and the second p-channel field effect transistor each having a source coupled to the supply voltage, wherein upon activation of the supply voltage the latch is always set to the first logic state.

9. The latch of claim 8 further comprising a switch coupled across the second n-channel field effect transistor for selectively switching the latch between the first logic state and the second logic state.

10. The latch of claim 9, wherein the switch includes a third n-channel field effect transistor.

11. The latch of claim 9, wherein the switch is responsive to an input signal for switching the latch from the first logic state to the second logic state.

12. The latch of claim 9 wherein the input signal is a pulse signal.

13. The latch of claim 8, further comprising a reset switch coupled between the first data node and ground for selectively resetting the latch to the first logic state.

14. The latch of claim 13, wherein the reset switch includes a fourth n-channel field effect transistor.

15. The latch of claim 8, wherein the thin film resistor is an intracell polysilicon resistor.

16. The latch of claim 8 further comprising an output data node defined by the first p-channel field effect transistor and the first n-channel field effect transistor each having a gate coupled together, and wherein the SEU hardening component includes a polysilicon resistor located in the second cross coupled segment between the output data node and the second data node.

17. The latch of claim 8 wherein the first p-channel field effect transistor and the first n-channel field effect transistor each includes a gate which are tied together defining a third data node, wherein the second p-channel field effect transistor and the second n-channel field effect transistor each includes a gate which are tied together to define a fourth data node, wherein the first coupling segment is between the first data node and the fourth data node, and wherein the second coupling segment is between the third data node and the second data node.

18. The latch of claim 17, wherein the SEU hardening component includes a thin film resistor located in the first coupling segment.

19. The latch of claim 18, wherein the SEU hardening component further includes a thin film resistor located in the second coupling segment.

20. The latch of claim 17, wherein the SEU hardening component includes a thin film resistor in the second coupling segment.

21. An SEU hardened bi-stable reconfigurable latch coupled to a supply voltage having a first logic state and a second logic state, the latch comprising:
- a first inverter including a first p-channel field effect transistor, a first n-channel field effect transistor, and a first data node located between the first p-channel transistor and the first n-channel transistor;
- a second inverter including a second p-channel field effect transistor, a second n-channel field effect transistor and a second data node located between the second p-channel field effect transistor and the second n-channel field effect transistor, wherein the first inverter is cross-coupled to the second inverter via a first coupling segment and a second coupling segment, wherein the first p-channel field effect transistor is symmetric with the second p-channel field effect transistor, and wherein the first data node has a first nodal capacitance and the second data node has a second nodal capacitance asymmetric with the first nodal capacitance;
- an SEU hardening component operably positioned within the first coupling segment or the second coupling segment of the latch, wherein the SEU hardening component is a thin film resistor;
- wherein the first p-channel field effect transistor and the second p-channel field effect transistor each having a source coupled to the supply voltage, wherein upon activation of the supply voltage the latch is always set to the first logic state; and
- a switch including a third field effect transistor positioned across the second n-channel field effect transistor for selectively switching the latch between the first logic state and the second logic state, wherein the first n-channel field effect transistor includes a first drain area, the second n-channel field effect transistor includes a second drain area, and the third field effect transistor includes a third drain area, wherein the first drain area is greater than the sum of the second drain area and the third drain area.

22. The latch of claim 21, wherein the first drain area is more than twice the sum of the second drain area and the third drain area.

23. The latch of claim 21, wherein the third field effect transistor is a third n-channel field effect transistor.

24. A bi-stable reconfigurable CMOS latch coupled to a supply voltage having a first logic state and a second logic state, the latch comprising:

a first inverter including a first p-channel field effect transistor, a first n-channel field effect transistor, and a first data node located between first p-channel field effect transistor and the first n-channel field effect transistor;

a second inverter including a second p-channel field effect transistor, a second n-channel field effect transistor and a second data node located between the second p-channel field effect transistor and the second n-channel field effect transistor, wherein the first inverter is cross-coupled to the second inverter via a first coupling segment and a second coupling segment, wherein the first coupling segment and the second coupling segment are not within the first inverter and the second inverter, wherein the first p-channel field effect transistor is symmetric with the second p-channel field effect transistor, and wherein the first n-channel field effect transistor includes a first drain area and the second n-channel field effect transistor includes a second drain area, wherein the first drain area is greater than the second drain area resulting in the first data node having a first nodal capacitance and the second data node having a second nodal capacitance asymmetric with the first nodal capacitance;

an SEU hardening component operably positioned within the first coupling segment or the second coupling segment of the latch, wherein the SEU hardening component is a thin film resistor;

wherein the first p-channel field effect transistor and the second p-channel field effect transistor each having a source coupled to the supply voltage, wherein upon application of the supply voltage the latch is always set to the first logic state; and a switch coupled across the second n-channel field effect transistor for selectively switching the latch between the first logic state and the second logic state.

25. The latch of claim 24, wherein the switch includes a third n-channel field effect transistor.

26. The latch of claim 24, wherein the switch is responsive to an input signal for switching the latch from the first logic state to the second logic state.

27. The latch of claim 24, further comprising a reset switch coupled between the first data node and ground for selectively resetting the latch to the first logic state.

28. The latch of claim 27, wherein the reset switch includes a fourth n-channel field effect transistor.

29. A single event upset (SEU) hardened circuit comprising:

a critical path SEU hardened logic circuit portion; and a non-critical path logic circuit portion comprising:

an SEU hardened asymmetric bi-stable CMOS latch having a first logic state and a second logic state, the latch comprising:

a first inverter including a first p-channel field effect transistor, a first n-channel field effect transistor, and a first data node located between the first p-channel transistor and the first n-channel transistor;

a second inverter including a second p-channel field effect transistor, a second n-channel field effect transistor and a second data node located between the second p-channel field effect transistor and the second n-channel field effect transistor, wherein the first inverter is cross-coupled to the second inverter via a first coupling segment and a second coupling segment, wherein the first coupling segment and the second coupling segment are not within the first inverter and the second inverter, wherein the first p-channel field effect transistor is symmetric with the second p-channel field effect transistor, and wherein the first n-channel field effect transistor includes a first drain area and the second n-channel field effect transistor includes a second drain area, wherein the first drain area is greater than the second drain area resulting in the first data node having a first nodal capacitance and the second data node having a second nodal capacitance asymmetric with the first nodal capacitance;

an SEU hardening component operably positioned within the first coupling segment or the second coupling segment of the latch, wherein the SEU hardening component is a thin film resistor; and a supply voltage operably coupled to the asymmetric bi-stable latch, wherein upon activation of the supply voltage the asymmetric bi-stable latch is always set to the first logic state.

30. A field programmable gate array comprising:

a critical path logic circuit portion including an array of logic devices;

a non-critical path logic circuit portion including an asymmetric bi-stable CMOS latch having a first logic state and a second logic state, the latch comprising:

a first inverter including a first p-channel field effect transistor, a first n-channel field effect transistor, and a first data node located between first p-channel field effect transistor and the first n-channel field effect transistor;

a second inverter including a second p-channel field effect transistor, a second n-channel field effect transistor and a second data node located between the second p-channel field effect transistor and the second n-channel field effect transistor, wherein the first inverter is cross-coupled to the second inverter via a first coupling segment and a second coupling segment, wherein the first coupling segment and the second coupling segment are not within the first inverter and the second inverter, wherein the first p-channel field effect transistor is symmetric with the second p-channel field effect transistor, and wherein the first n-channel field effect transistor includes a first drain area and the second n-channel field effect transistor includes a second drain area, wherein the first drain area is greater than the second drain area resulting in the first data node having a first nodal capacitance and the second data node having a second nodal capacitance asymmetric with the first nodal capacitance;

an SEU hardening component operably positioned within the first coupling segment or the second coupling segment of the latch, wherein the SEU hardening component is a thin film resistor;

wherein the first p-channel field effect transistor and the second p-channel field effect transistor each having a source coupled to the supply voltage, wherein upon application of the supply voltage the latch is always set to the first logic state; and a supply voltage operably coupled to the asymmetric bi-stable latch, wherein upon activation of the supply voltage the asymmetric bi-stable latch is always set to the first logic state.

31. The array of claim 30, wherein the asymmetric bi-stable CMOS latch is SEU hardened including a thin film resistor positioned in only one of the first coupling segment or the second coupling segment.

32. The array of claim 30, wherein the array of logic devices includes a first logic device, and further wherein the asymmetric bi-stable latch is operably coupled to the first logic device for controlling activation of the asymmetric bi-stable latch.

33. power failure detector comprising:
an asymmetric bi-stable CMOS latch having a first logic state and a second logic state, the latch comprising:
a first inverter including a first p-channel field effect transistor, a first n-channel field effect transistor, and a first data node located between the first p-channel transistor and the first n-channel transistor;
a second inverter including a second p-channel field effect transistor, a second n-channel field effect transistor and a second data node located between the second p-channel field effect transistor and the second n-channel field effect transistor, wherein the first inverter is cross-coupled to the second inverter via a first coupling segment and a second coupling segment, wherein the first coupling segment and the second coupling segment are not within the first inverter and the second inverter, wherein the first p-channel field effect transistor is symmetric with the second p-channel field effect transistor, and wherein the first n-channel field effect transistor includes a first drain area and the second n-channel field effect transistor includes a second drain area, wherein the first drain area is greater than the second drain area resulting in the first data node having a first nodal capacitance and the second data node having a second nodal capacitance asymmetric with the first nodal capacitance;
an SEU hardening component operably positioned within the first compiling segment or the second coupling segment of the latch;
a supply voltage operably coupled to the asymmetric bi-stable latch, wherein upon application of the supply voltage the asymmetric bi-stable CMOS latch is always set to the first logic state; and
a switch operably coupled to the asymmetric bi-stable CMOS latch for changing the asymmetric bi-stable CMOS latch from the first logic state to the second logic state, and
wherein upon loss of the supply voltage and subsequent restoration of the supply voltage the asymmetric bi-stable latch returns to the first logic state to indicate that a loss of supply voltage has occurred.

34. The latch of claim 33, wherein the switch includes a third n-channel field effect transistor coupled across the second n-channel field effect transistor for selectively switching the latch between the first logic state and the second logic state.

35. The latch of claim 33, wherein the switch is responsive to an input signal for switching the latch from the first logic state to the second logic state.

36. The latch of claim 33, further comprising a reset switch coupled between the first node and ground for selectively resetting the latch to the first logic state.

37. The latch of claim 36, wherein the reset switch includes a fourth n-channel field effect transistor.

38. The detector of claim 33, wherein the asymmetric bi-stable CMOS latch is SEU hardened.

39. The detector of claim 33, wherein the asymmetric bi-stable CMOS latch includes an SEU hardening component.

40. A method of operating a field programmable gate array comprising the steps of:
defining a critical path logic circuit portion including an array of logic devices;
defining a non-critical path logic circuit portion including an asymmetric bi-stable CMOS latch having a first logic state and a second logic state, the latch comprising:
a first inverter including a first p-channel field effect transistor, a first n-channel field effect transistor, and a first data node located between the first p-channel transistor and the first n-channel transistor;
a second inverter including a second p-channel field effect transistor, a second n-channel field effect transistor and a second data node located between the second p-channel field effect transistor and the second n-channel field effect transistor, wherein the first inverter is cross-coupled to the second inverter via a first coupling segment and a second coupling segment, wherein the first coupling segment and the second coupling segment are not within the first inverter and the second inverter, wherein the first p-channel field effect transistor is symmetric with the second p-channel field effect transistor, and wherein the first n-channel field effect transistor includes a first drain area and the second n-channel field effect transistor includes a second drain area, wherein the first drain area is greater than the second drain area resulting in the first data node having a first nodal capacitance and the second data node having a second nodal capacitance asymmetric with the first nodal capacitance;
SEU hardening component operably positioned within the first compiling segment or the second coupling segment of the latch; and
activating a supply voltage coupled to the asymmetric bi-stable latch, to set the asymmetric bi-stable latch to the first logic state.

41. The method of claim 40, wherein the first inverter is a first CMOS inverter and the second inverter is a second CMOS inverter cross coupled to the first CMOS inverter, wherein the first CMOS inverter is asymmetric with the second CMOS inverter.

42. The method of claim 40, further comprising the step of defining the asymmetric bi-stable CMOS latch as SEU hardened.

43. The method of claim 42, wherein the SEU hardening component includes positioning a thin film resistor in the first coupling segment.

44. The method of claim 40, further comprising the step of reconfiguring the asymmetric CMOS bi-stable latch between the first logic state and the second logic state via a switch operably coupled to the asymmetric CMOS bi-stable latch.

45. The method of claim 44, further comprising the step of defining the switch as including an n-channel transistor.

46. The method of claim 45, further comprising the step of receiving a pulsed input signal by the n-channel transistor for switching the asymmetric bi-stable latch between the first logic state and the second logic state.

47. The method of claim 40, further comprising the step of resetting the asymmetric CMOS bi-stable latch to the first logic state via a reset switch operably coupled to the asymmetric CMOS bi-stable latch.

* * * * *